United States Patent
Inagaki et al.

[11] Patent Number: 5,837,155
[45] Date of Patent: Nov. 17, 1998

[54] INSULATING RESIN COMPOSITION FOR BUILD-UP BY COPPER FOIL LAMINATION AND METHOD FOR PRODUCTION OF MULTILAYER PRINTED CIRCUIT BOARD USING THE COMPOSITION

[75] Inventors: Shoji Inagaki, Ranzan-machi; Eiji Takehara, Higashimurayama, both of Japan

[73] Assignee: Taiyo Ink Manufacturing Co., Ltd., Tokyo, Japan

[21] Appl. No.: 696,661

[22] Filed: Aug. 14, 1996

[30] Foreign Application Priority Data

Aug. 28, 1995 [JP] Japan .................................. 7-240495

[51] Int. Cl.⁶ ..................................................... B44C 1/22
[52] U.S. Cl. ................................... 216/18; 216/20; 216/34
[58] Field of Search ................................. 216/13, 18, 20, 216/33, 34, 41, 78, 105

[56] References Cited

U.S. PATENT DOCUMENTS 4,902,556  2/1990  Benedikt et al. ...................... 216/20 X
5,595,858  1/1997  Akama et al. ......................... 216/20 X

*Primary Examiner*—William Powell
*Attorney, Agent, or Firm*—Ronald P. Kananen

[57] ABSTRACT

An insulating resin composition for the build-up of multi-layer circuits by the procedure of copper foil lamination and a method for the production of a multilayer printed circuit board by the use of the insulating resin composition are disclosed. The insulating resin composition comprises at least one species of epoxy resin having a softening point of not more than 110° C., a monomer or an oligomer possessing an unsaturated double bond, an epoxy resin curing agent, and a photopolymerization initiator. The insulating resin composition is applied to a printed circuit board throughout the entire area thereof so as to cover conductor patterns formed thereon and then irradiated with UV light. Subsequently a copper foil is superposed on the applied layer of the insulating resin composition on the printed circuit board by means of a heated pressure roller to effect lamination thereof. The insulating resin composition is thermally cured to give a multilayer laminate and then the outer layer copper foil of the produced multilayer laminate is selectively etched to form a prescribed conductor pattern.

30 Claims, 4 Drawing Sheets

INSULATING RESIN COMPOSITION FOR BUILD-UP BY COPPER FOIL LAMINATION AND METHOD FOR PRODUCTION OF MULTILAYER PRINTED CIRCUIT BOARD USING THE COMPOSITION

BACKGROUND OF THE INVENTION

1. Field of the Invention

This invention relates to an insulating resin composition for a build-up of multilayer circuits by means of copper foil lamination and a method for the production of a multilayer printed circuit board using the insulating resin composition.

2. Description of the Prior Art

The conventional process for the lamination of a multilayer printed circuit board comprises the step of layup (superposing) and the step of multilayer forming press. For the layup step, the procedure which comprises laying up semi-cured prepreg sheets obtained by impregnating such basis as glass cloth with resin varnish and drying the impregnated basis on the opposite surfaces of an inner layer plate having conductor patterns formed thereon and further laying up copper foils or copper-clad laminates as outer layers sequentially thereon is adopted. The multilayer forming press step consists in laminating the laid-up materials by the cooperation of heat and pressure that is attained in such an apparatus as a laminating press, a vacuum laminating press, and an autoclave.

The method of lamination is known in two types, the mass lamination method and the pin lamination method. In the combination of superposed layers, generally when just one inner layer plate A is used which comprises an insulating substrate 101 and conductor patterns 102 deposited on both the opposite surfaces of the substrate 101 as shown in FIG. 1, the mass lamination method (which is generally adopted, where not more than four layers are superposed) is adopted because the lamination has no need for registering conductor patterns. This method comprises laying up prepregs 103 and copper foils 104 severally on the opposite surfaces of the inner layer plate A having the conductor patterns 102 formed thereon and laminating the superposed layers.

When two or more inner layer plates A, B having conductor patterns 102 formed thereon are involved as shown in FIG. 2, the pin lamination method (which is generally adopted where five or more layers are superposed) is adopted. This method comprises preparatorily perforating reference holes 106 for registration in the inner layer plates A and B, prepregs 103, and copper foils 104 to be laid up, passing positioning pins 105 through the reference holes 106 in the laid-up layers, setting the laid-up layers in place in a lamination jig not shown in the diagram, and laminating them.

The layup step, however, must consume much time and labor because it requires to vary the quantity, kind, size, etc. of the prepregs 103 to be laid up, depending on the plate thickness and size of the finished products. The pin lamination method attains necessary registration of the laid-up layers with the aid of the positioning pins 105 and, therefore, requires the reference holes 106 to be preparatorily perforated at the four corners or at the centers of not only the inner layer plates A and B, copper foils 104, and prepregs 103 but also release films, metal die plates, etc. which are not shown in the diagram.

Further, the layup step entails the problem of sacrificing the yield of production owing to the possible infliction of such defects as wrinkles and scratches on the copper foils.

Then, at the multilayer forming press step, the semi-cured resin in the prepregs which have been superposed by laminating the laid-up materials by the cooperation of heat and pressure in a press, a vacuum laminating press, or an autoclave is melted, liquefied, and further gelled and consequently enabled to harden in a state enveloping the conductor patterns and filling the gaps in the conductor patterns.

This step covers a cycle which comprises elevation of temperature, exertion of pressure (of a low magnitude), application of heat, exertion of pressure, cooling, and release of compression. Under the multilayer forming conditions using a standard glass-epoxy substrate, the whole cycle of this step requires a duration in the approximate range of from two hours 30 minutes to three hours for its completion. This step uses a vacuum laminating press, an autoclave or the like and, therefore, proves expensive and large-scale in terms of equipment.

SUMMARY OF THE INVENTION

An object of the present invention, therefore, is to provide a method which is capable of producing a multilayer printed circuit board quickly at a low cost with a simple laminating step while eliminating the problems suffered by the prior art as described above. More specifically, the present invention provides a method for the production of a multilayer printed circuit board by the procedure of copper foil lamination which comprises forming the coating of an insulating resin composition on the surface of an insulating substrate having a conductor pattern formed thereon and causing a copper foil to be fast superposed on the coating by means of a heated pressure roller.

A further object of the present invention is to provide an insulating resin composition which permits a multilayer printed circuit board holding the component layers with high interlaminar adhesive strength and incorporating therein an insulating resin layer of a uniform thickness to be produced quickly with high productivity by the procedure mentioned above.

To accomplish the object mentioned above, the present invention provides an insulating resin composition for the build-up of multilayer circuits by the procedure of copper foil lamination, characterized by containing (A) at least one species of epoxy resin having a softening point of not more than 110° C., (B) a monomer or an oligomer possessing an unsaturated double bond, (C) an epoxy resin curing agent, and (D) a photopolymerization initiator as essential components thereof.

In a preferred embodiment, the composition contains the epoxy resin (A) having a softening point of not more than 110° C. in a proportion of not less than 20% by weight and the monomer or oligomer (B) possessing an unsaturated double bond in a proportion of not more than 60% by weight, both based on the weight of the insulating resin composition. The insulating resin composition of the present invention may contain (E) fine rubber particles besides the components (A) to (D) mentioned above.

The present invention further provides a method for the production of a multilayer printed circuit board, characterized by providing as an inner layer plate a printed circuit board comprising an insulating substrate and at least one layer of conductor pattern formed thereon, applying the aforementioned insulating resin composition of the present invention to the entire surface of the insulating substrate having the conductor pattern formed thereon so as to cover the conductor pattern, irradiating the applied layer of the insulating resin composition with ultraviolet light (hereinafter referred to briefly as "UV irradiation"), then superposing a copper foil thereon by means of a heated pressure roller thereby effecting lamination thereof, further thermally curing the insulating resin composition, and thereafter selectively etching the copper foil forming the outer layer of the produced multilayer laminate thereby imparting a conductor pattern thereto. In this case, the application of the insulating resin composition mentioned above may be substituted by a procedure which comprises preparatorily converting the insulating resin composition of the present invention into a dry film and attaching the produced insulating resin film to the insulating substrate by means of lamination. Otherwise, the procedure of superposing the copper foil subsequent to the application of the insulating resin composition and the UV irradiation may be substituted by the procedure which comprises superposing a resin-laminated copper foil prepared by preparatorily applying the insulating resin composition to the copper foil and subjecting it to UV irradiation on the insulating substrate.

In the production of the multilayer printed circuit board having further layers, the number of layers may be increased by repeating the procedure of superposition mentioned above on the surface of the conductor pattern imparted to the outer layer of the multilayer printed circuit board produced by the method described above. After completion of the lamination of the outermost copper foil, the perforation of through-holes, deposition of a copper layer, formation of the outermost conductor pattern, and formation of a solder resist film are carried out.

The copper foil to be applied to the insulating resin layer by the heated pressure roller or the copper foil to be used for the production of the resin-laminated copper foil may have the surface to be used for adhesion (hereinafter referred to briefly as the "working surface") preparatorily coarsened and/or coated with an adhesive agent prior to the superposition.

BRIEF DESCRIPTION OF THE DRAWINGS

Other objects, features, and advantages of the invention will become apparent from the following description taken together with the drawings, in which:

FIG. 3 representing a double-sided copper-clad laminate, FIG. 4 a double-sided printed circuit board having conductor patterns formed on both surfaces thereof, FIG. 5 the double-sided printed circuit board having the opposite surfaces thereof coated with an insulating resin composition, FIG. 6 the double-sided printed circuit board having the opposite surfaces thereof coated with an insulating resin composition and further having copper foils laminated fast one each to the opposite surfaces thereof, FIG. 7 a multilayer laminate having copper foils laminated fast thereto and further having a through-hole perforated therein, FIG. 8 the multilayer laminate containing the through-hole and having panel copper plating layers formed on the exposed surface thereof, FIG. 9 the multilayer laminate having outer layer conductor patterns formed thereon, and FIG. 10 the multilayer printed circuit board having solder resist films formed thereon.

DETAILED DESCRIPTION OF THE INVENTION

Figure 1:
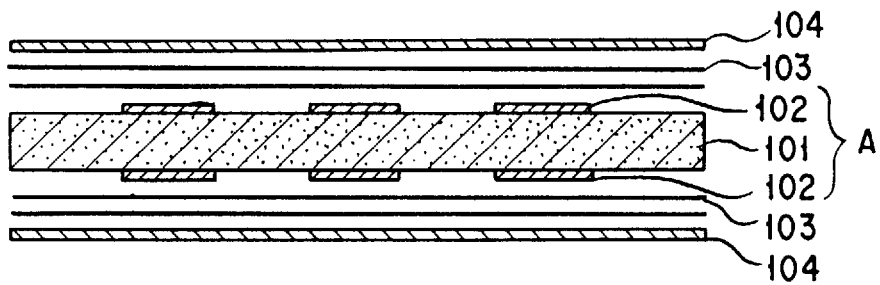
FIG. 1 is a schematic diagram showing an example of the layer construction of a multilayer laminate having one inner layer plate which is obtained by the conventional method of mass lamination.
Figure 2:
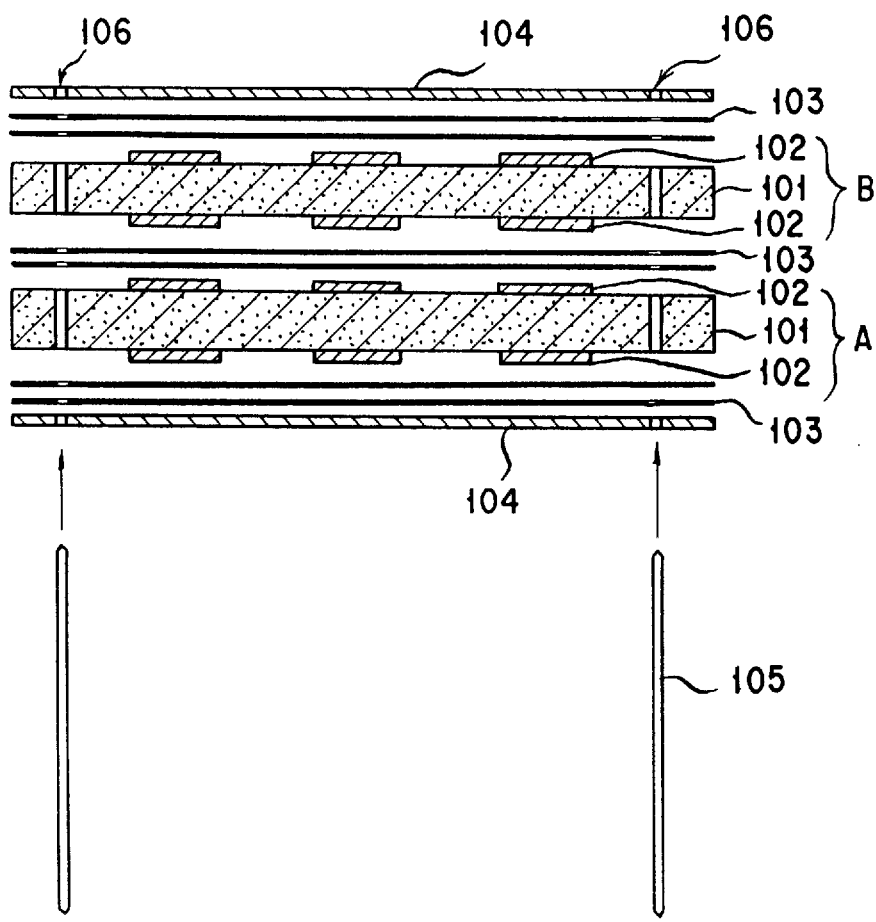
FIG. 2 is a schematic diagram showing an example of the layer construction of a multilayer laminate having two inner layer plates which is obtained by the conventional method of pin lamination.

The method for the production of a multilayer printed circuit board of the present invention is characterized, as described above, by providing as an inner layer plate a printed circuit board comprising an insulating substrate and at least one layer of conductor pattern formed thereon, applying an insulating resin composition to the entire surface of the insulating substrate having the conductor pattern formed thereon so as to cover the conductor pattern, subjecting the applied layer to the UV irradiation, then superposing a copper foil thereon by means of a heated pressure roller thereby effecting lamination thereof. The insulating resin composition mentioned above functions as an adhesive agent for the copper foil involved in the lamination and, at the same time, gives rise to an insulating resin layer in the multilayer printed circuit board to be ultimately produced.

In the method for the production of such a multilayer printed circuit board of the present invention as described above, since the inner layer plate having the insulating resin composition applied preparatorily thereto is conveyed to the step of copper foil lamination by such conveying means as rollers, the applied insulating resin composition is appropriately such that it will be caused by the UV irradiation to assume a semi-cured condition in which the photopolymerizable monomer or oligomer possessing an unsaturated double bond has undergone a reaction while the epoxy resin has survived the reaction, will be then softened by the heat applied by the heated pressure rollers and consequently enabled to exhibit an ample adhesive strength to the copper foil, and will refrain from flowing and retain a fixed film thickness intact.

The present inventors, after pursuing a diligent study in search of an insulating resin composition capable of fulfilling the requirement described above, have found that an insulating resin layer exhibiting high adhesive strength to the copper foil intended for lamination and retaining uniform film thickness can be obtained by using an insulating resin composition comprising (A) at least one species of epoxy resin having a softening point of not more than 110° C., (B) a monomer or an oligomer possessing an unsaturated double bond, (C) an epoxy resin curing agent, and (D) a photopolymerization initiator as essential components thereof. The present invention has been perfected as a result.

The insulating resin composition of the present invention, owing to the use of an epoxy resin in combination with a monomer or an oligomer possessing an unsaturated double bond, is characterized in that the photopolymerizable monomer or oligomer possessing an unsaturated double bond is caused by the UV irradiation to undergo a reaction and assume a semi-cured condition and, at the same time, the epoxy resin in the unreacted state is softened by virtue of the heat from the heated pressure roller and therefore caused to adhere fast to the copper foil, and thereafter the composition is heated to be fully cured.

If the epoxy resin having a softening point of not more than 110° C. is not used at all as the epoxy resin component of the insulating resin composition, the adhesion of the copper foil by lamination carried out at a roll temperature in the range of 80° to 150° C. at a roll speed in the range of 0.5 to 3 m/min. will not easily soften the insulating resin composition and will fail to impart ample adhesive strength to the copper foil.

If the use of the monomer or the oligomer possessing an unsaturated double bond is omitted, the epoxy resin effectively usable will be restricted to a considerable extent and the combined use of two or more species of epoxy resin will be become inevitable because the assumption of the semi-cured condition by the UV irradiation is not easily realized.

The insulating resin composition of the present invention has eliminated such adverse phenomena as mentioned above by using at least one species of epoxy resin having a softening point of not more than 110° C. in combination with a monomer or an oligomer possessing an unsaturated double bond as described above.

As a result, the multilayer printed circuit board can be produced by a relatively simple step of superposition according to such a procedure of copper foil lamination as described above. According to the method for the production of the multilayer printed circuit board of the copper foil lamination type using the insulating resin composition of the present invention, the step of applying the insulating resin composition is attained by conditioning the surface of the inner layer plate by a standard technique and carrying out the application of the composition to the conditioned surface by such a highly productive conventional technique as the screen printing or curtain coating. Since the step of conferring the semi-cured condition on the applied layer of the insulating resin composition is implemented by the UV irradiation, it can be carried out quickly with high operational efficiency unlike the conventional drying step which consumes a relatively long time. Further, the step of causing copper foil lamination by the use of the heated pressure roller can be efficiently carried out with a device which equals the standard commercially available automatic film joining device for a dry film.

By causing the aforementioned layer of the insulating resin composition to be thermally cured after the step of copper foil lamination, there a multilayer laminate is obtained which has the insulating resin layer and the copper foil mutually attached with high adhesive strength and permits the insulating resin layer to acquire a uniform thickness.

As concrete examples of the epoxy resin (A) required to have a softening point of not more than 110° C. as mentioned above, bisphenol A type epoxy resins such as EPIKOTE® 807, EPIKOTE® 828, EPIKOTE® 1001, and EPIKOTE® 1004 (proprietary products of Yuka-Shell Epoxy K.K.), EPICLON® 840, EPICLON® 850, EPICLON® 1050, and EPICLON® 2055 (proprietary products of Dai-Nippon Ink & Chemicals, Inc.), Epo Tohto® YD-011, YD-013, YD-127, and YD-128 (proprietary products of Tohto Kasei K.K.), D.E.R.® 317, D.E.R.® 331, D.E.R.® 661, and D.E.R.® 664 (proprietary products of the Dow Chemical Company), ARALDITE® 6071, ARALDITE® 6084, ARALDITE® GY250, and ARALDITE® GY260 (proprietary products of Ciba Geigy Ltd.), SUMI-Epoxy® ESA-011, ESA-014, ELA-115, and ELA-128 (proprietary products of Sumitomo Chemical Industries Co., Ltd.), and A.E.R. 330, A.E.R. 331, A.E.R. 661, and A.E.R. 664 (proprietary products of Asahi Chemical Industry Co., Ltd.); brominated epoxy resins such as EPIKOTE® YL903 (proprietary product of Yuka-Shell Epoxy K.K., EPICLON® 152 and EPICLON® 165 (proprietary products of Dai-Nippon Ink & Chemicals, Inc.), Epo Tohtos YDB-400 and YDB-500 (proprietary products of Tohto Kasei K.K.), D.E.R.® 542 (proprietary product of the Dow Chemical Company), ARALDITE® 8011 (proprietary product of Ciba Geigy Ltd.), SUMI-Epoxy® ESB-400 and ESB-700 (proprietary products of Sumitomo Chemical Industries Co., Ltd.), and A.E.R. 711 and A.E.R. 714 (proprietary products of Asahi Chemical Industry Co., Ltd.); novolak type epoxy resins such as EPIKOTE® 152 and EPIKOTE® 154 (proprietary products of Yuka-Shell Epoxy K.K.), D.E.N. 431 and D.E.N. 438 (proprietary products of the Dow Chemical Company), EPICLON® N-730, EPICLON® N-770, and EPICLON® N-865 (proprietary products of Dai-Nippon Ink & Chemicals, Inc.), Epo Tohto® YDCN-701 and YDCN-704 (proprietary products of Tohto Kasei K.K.), ARALDITE® ECN1235, ARALDITE® ECN1273, ARALDITE® ECN1299, and ARALDITE® XPY307 (proprietary products of Ciba Geigy Ltd.), EPPN-201, EOCN-1025, EOCN-104S, and RE-306 (proprietary products of Nippon Kayaku Co., Ltd.), SUMI-Epoxy® ESCN-195X and ESCN-220 (proprietary products of Sumitomo Chemical Industries Co., Ltd.), and A.E.R. ECN-235 and ECN-299 (proprietary products of Asahi Chemical Industry Co., Ltd.); bisphenol F type epoxy resins such as EPICLON® 830 (proprietary product of Dai-Nippon Ink & Chemicals, Inc.), Epo Tohto® YDF-170, YDF-175, and YDF-2004 (proprietary products of Tohto Kasei K.K.), and ARALDITE® XPY 306 (proprietary product of Ciba Geigy Ltd.); hydrogenated bisphenol A type epoxy resins such as Epo Tohto® ST-3000 (proprietary product of Tohto Kasei K.K.); glycidyl amine type epoxy resins such as EPIKOTE® 604 (proprietary product of Yuka-Shell Epoxy K.K.), Epo Tohto® YH-434 (proprietary product of Tohto Kasei K.K.), ARALDITE®MY720 (proprietary product of Ciba Geigy Ltd.), and SUMI-Epoxy® ELM-120 (proprietary product of Sumitomo Chemical Industries Co., Ltd.); Hydantoin type epoxy resins such as ARALDITE® CY-350 (proprietary product of Ciba Geigy Ltd.); alicyclic type epoxy resins such as Celloxide® 2021 (proprietary product of Daicel Ltd.) and ARALDITE® CY175 and CY179 (proprietary products of Ciba Geigy Ltd.); trihydroxyphenyl methane type epoxy resins such as YL-933 (proprietary product of Yuka-Shell Epoxy K.K.) and T.E.N. (proprietary product of the Dow Chemical Company); bixylenol type or biphenyl type epoxy resins such as YX-4000 and YL-6121 (proprietary products of Yuka-Shell Epoxy K.K.); bisphenol S type epoxy resins such as EXA-1514 (proprietary product of Dai-Nippon Ink & Chemicals, Inc.); bisphenol A novolak type epoxy resins such as EPIKOTE® 157S (proprietary product of Yuka-Shell Epoxy K.K.); tetraphenylol ethane type epoxy resins such as EPIKOTE® YL-931 (proprietary product of Yuka-Shell Epoxy K.K.) and ARALDITE® 163 (proprietary product of Ciba Geigy Ltd.); and heterocyclic type epoxy resins such as ARALDITE® PT810 (proprietary product of Ciba Geigy Ltd.) and TEPIC® (proprietary product of Nissan Chemicals Industries, Ltd.) may be cited.

The amount of the epoxy resin (A) having a softening point of not more than 110° C. to be incorporated in the insulating resin composition is appropriately not less than 20% by weight, preferably in the range of 30 to 60% by weight, based on the weight of the insulating resin composition. If the epoxy resin (A) having a softening point of not more than 110° C. is incorporated in an weight of less than 20% by weight, the disadvantage ensues that the adhesion of the resin layer to the copper foil will not be easily obtained with amply high fastness.

Concrete examples of the monomer or the oligomer (B) which possesses an unsaturated double bond as mentioned above include, but are not limited to: 2-hydroxyethyl acrylate, 2-hydroxyprophyl acrylate, N-vinylpyrrolidone, acryloyl morpholine, methoxytetraethylene glycol acrylater methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acrylte, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxyethyl acrylate, tetrahydrofurfuryl acrylate, cyclohexyl acrylate, glycerin diglycidyl ether diacrylate, glycerin triglycidyl ether triacrylate, isobornyl acrylate, cyclopentadiene mono- or di- acrylate; polyacrylates of polyhydric alcohols such as hexane diol, trimethylol propane, pentaerythritol, ditrimethylol propane, dipentaerythritol, and tris-hydroxyethyl isocyanurate, or of ethylene oxide or propylene oxide adducts thereof; and various methacrylates homologous to the acrylates mentioned above; and mono-, di-, tri-, and higher polyesters of polybasic acids with hydroxy alkyl (meth)acrylates.

The amount of the monomer or the oligomer (B) possessing an unsaturated double bond to be incorporated in the insulating resin composition is appropriately not more than 60% by weight, preferably in the range of 20 to 40% by weight, based on the weight of the insulating resin composition. If the monomer or the oligomer (B) possessing an unsaturated double bond is incorporated in an amount exceeding 60% by weight, the disadvantage ensues that the adhesion of the resin layer to the copper foil will not be easily obtained with amply high fastness.

As examples of the epoxy resin curing agent (C) which is used in combination with the epoxy resin (A) mentioned above as an essential component in the insulating resin composition of the present invention, amines, acid anhydrides, aminopolyamide resins, polysulfide resins, boron trifluoride-amine complex, novolak resins, dicyandiamide, acid hydrazide, and carboxyl group-containing compounds may be cited.

Concrete Examples of the epoxy resin curing agents (C) mentioned above include, but are not limited to: amines such as diethylene triamine, triethylene tetramine, isophorone diamine, m-xylylene diamine, m-phenylene diamine, p-phenylene diamine, 4,4'-diaminodiphenyl methane, 4,4'-diaminodiphenyl sulfone, 4,4'-diaminodiphenyl ether, and aniline-formalin resin; acid anhydrides such as phthalic anhydride, hexahydrophthalic anhydride, nadic anhydride, methylnadic anhydride, trimellitic anhydride, pyromellitic anhydride, and benzophenone-tetracarboxylic dianhydride; aminopolyamide resins which are condensates of dimer acids with diethylene triamine, triethylene tetramine, or the like; polysulfide resin having a mercapto group at the terminal thereof; boron trifluoride-amine complex of boron trifluoride with aniline, benzyl amine, ethyl amine, or the like; novolak resins obtained by a condensation reaction of formalin with phenol, cresol, xylenol, resorcin, or the like; and the latent curing agents such as dicyandiamide, dihydrazide adipate, hydrazide sebacate, and melamine. Besides, such carboxyl group-containing compounds as (meth) acrylic acid copolymers represented by the product of Johnson Polymer K.K. marketed under trademark designation of "Johncril-68" are likewise usable.

Appropriately, the amount of the epoxy resin curing agent to be used in the insulating resin composition of the present invention is such that, in the case of the amines, polyamide resin, polysulfide resin, boron trifluoride-amine complex, and novolak resin, the active hydrogen content in the curing agent falls in the range of 0.5 to 1.5 equivalent weights, preferably 0.8 to 1.2 equivalent weights per one epoxy equivalent of the epoxy resin component and, in the case of the acid anhydride, the anhydrous acid content falls in the range of 0.5 to 1.0 equivalent weight, preferably 0.7 to 0.9 equivalent weight per one epoxy equivalent of the epoxy resin component, and, in the case of the latent curing agent, the active hydrogen content falls in the range of 0.2 to 1.2 equivalent weights, preferably 0.3 to 0.7 equivalent weight.

The insulating resin composition of the present invention, when necessary, may incorporate therein a curing accelerator or promotor. Concrete examples of the curing promoters include, but are not limited to: tertiary amines such as triethyl amine, tributyl amine, dimethylbenzyl amine, diethylbenzyl amine, 4-(dimethyl-amino)-N,N-dimethylbenzyl amine, 4-methoxy-N,N-dimethylbenzyl amine, and 4-methyl-N,N-dimethylbenzyl amine; quaternary ammonium salts such as benzyltrimethylammonium chloride and benzyltriethylammonium chloride; phosphines such as triethylphosphine and triphenylphosphine; phosphonium salts such as n-butyl-triphenylphosphonium bromide; imidazoles such as imidazole, 2-methylimidazole, 2-ethylimidazole, 2-ethyl-4-methylimidazole, 2-phenylimidazole, 1-(2-cyanoethyl)-2-ethyl-4-methylimidazole, or organic acid salts thereof; guanamines such as acetoguanamine and benzoguanamine. Among other curing promotors cited above, imidazoles prove particularly suitable.

Examples of the photopolymerization initiators or photosensitizers (D) mentioned above include, but are not limited to: acetophenones such as acetophenone, 2,2-diethoxy-2-phenyl acetophenone, p-dimethylaminopropiophenone, dichloroacetophenone, trichloroacetophenone, p-tert-butyl trichloroacetophenone, 2-methyl-1-[4-(methylthio)phenyl]-2-morpholinopropane-1-on, and 2-benzyl-2-dimethylamino-1-(4-morpholinophenyl)-butane-1-on; benzophenones such as benzophenone, 2-chlorobenzophenone, p,p-dichlorobenzophenone, p,p-bis(dimethylamino) benzophenone, p,p-bis(diethylamino)benzophenone, and 4-benzoyl-4'-methyl-diphenyl sulfide; benzil; benzoin and ethers thereof such as benzoin methyl ether, benzoin ethyl ether, benzoin isopropyl ether, and benzoin isobutyl ether; ketals such as benzyl dimethyl ketal; thioxanthones such as thioxanthone, 2-chlorothioxanthone, and 2,4-diethylthioxanthone; anthraquinones such as 2-ethylanthraquinone and 2,3-diphenyl anthraquinone; organic peroxides such as benzoyl peroxide and cumene peroxide; thiol compounds such as 2-mercaptobenzimidazole, 2-mercaptobenzoxazole, and 2-mercaptobenzothiazole; organic halogen compounds such as 2,4,6-tris(trichloromethyl)-S-triazine, 2,2,2-tribromoethanol, and tribromomethylphenyl sulfone; and 2,4,6-trimethylbenzoyl diphenyl phosphine oxide. These compounds may be used either singly or in the form of a combination of two or more members. Optionally such a photopolymerization initiator (D) may be used in combination with one or more well-known conventional photopolymerization accelerators such as of the benzoic acid type and the tertiary amine type.

The amount of the photopolymerization initiator (D) to be used suitably falls in the range of 0.2 to 30 parts by weight, preferably 2 to 20 parts by weight, based on 100 parts by weight of the aforementioned monomer or oligomer (B) possessing an unsaturated double bond. If the amount of the photopolymerization initiator to be used is less than 0.2 part by weight, the composition will suffer from inferior photocuring property. Conversely, if the amount exceeds 30 parts by weight, the composition will entail the disadvantage of exhibiting poor stability during storage.

The insulating resin composition of the present invention may contain fine rubber particles for the purpose of exalting the fastness of adhesion thereof to the copper foil and enhancing the resistance thereof to the shock possibly exerted thereon during the work of cutting performed thereon and consequently precluding the occurrence of a crack.

The fine rubber particles of any species are invariably usable so long as they fulfill the requirement that they avoid being dissolved in other component so as to assume a dispersed state in the cured insulating resin layer. Where the resistance to heat, for example, demands special consideration, it is appropriate to use acryl type or butadiene type fine cross-linked rubber particles, particularly acrylic cross-linked rubber particles.

Since the fabrication of the produced multilayer printed circuit board as by cutting is carried out at room temperature, the fine rubber particles appropriately have a glass transition point of not more than 20° C. and a network chain density in the range of 0.01 to 1.4 m.mols/g so they are soft at room temperature. Further, in order for the fine rubber particles to assume a uniformly dispersed state in the insulating resin layer which generally has a thickness in the approximate range of 20 to 100 μm, they appropriately have particle diameters in the range of 0.01 to 10 μm.

The fine rubber particles can be added by themselves to the composition. Otherwise, they may be used as dispersed in an epoxy resin solvent such as, for example, an epoxy resin varnish or as dispersed in a diluent (solvent).

As concrete examples of the fine rubber particles, XER-91 produced by Japan Synthetic Rubber Co., Ltd. and Staphyloid AC-3355 produced by Takeda Chemical Industries, Ltd. may be cited. As concrete examples of the epoxy resin varnish having fine rubber particles dispersed therein, Epo Tohto® YR-528, YR-591, YR-570, and YR-516 produced by Tohto Kasei K.K. and Epodyne RB-2000 and RB-2010 produced by Resinas Kasei K.K. may be cited.

As concrete examples of the substance of which the fine rubber particles are made, acrylic rubber, styrene rubber, isoprene rubber, ethylene type rubbers, propylene rubber, urethane rubber, butyl rubber, silicone rubber, nitrile rubber, fluorine rubber, norbornene rubber, and ether type rubbers may be cited. Among other rubbers cited above, an acrylic rubber prooves particularly suitable.

Further, the insulating resin composition of the present invention may incorporate therein, as an occasion demands, a well-known and widely used filler such as barium sulfate, silicon sulfide, talc, magnesium oxide, calcium carbonate, zirconium silicate, zirconium oxide, calcium silicate, calcium hydroxide, silica, clay, bentonite, kaolin, glass fiber, carbon fiber, mica, asbestos, and metal powder; a color pigment such as phthalocyanine blue, phthalocyanine green, titanium dioxide, and carbon black; other various additives such as an anti-foaming agent, an adhesiveness-imparting agent, and a leveling agent, and organic solvents.

The insulating resin composition of the present invention can be advantageously applied to the production of a multilayer printed circuit board by the procedure of copper foil lamination because it can be semi-cured by the UV irradiation and then softened by the application of heat and pressure and consequently enabled to adhere with ample fastness to the copper foil involved in the lamination. It, therefore, allows production of a multilayer printed circuit board which has the component layers thereof mutually attached with high interlaminar strength and permits the insulating resin layer to acquire a uniform thickness.

Now, the component steps of the method for the production of a multilayer printed circuit board according to the present invention will be described below with reference to the drawings attached hereto. FIG. 3 through FIG. 11 are diagrams showing the steps for the manufacture of a multilayer printed circuit board by the method of the present invention. The board is specifically depicted as consisting of four layers.

Figure 3:
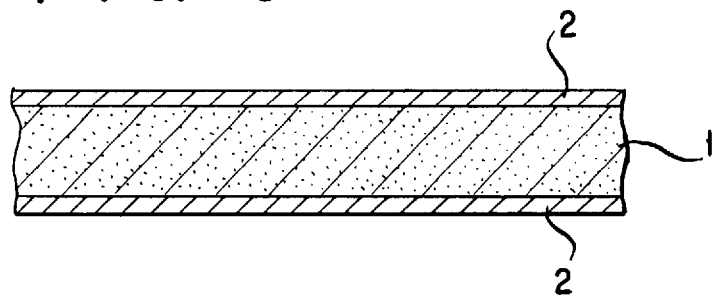
FIGS. 3 through 10 are schematic diagrams showing a process of manufacture in the method for the production of a multilayer printed circuit board of the present invention.

First, the formation of conductor patterns on an inner layer plate is attained by preparing a double-sided copper-clad laminate having copper foils 2, 35 μm or 70 μm in thickness, attached one each to the opposite surfaces of an insulating substrate 1 formed of a glass fabric substrate, a glass fabric, or a glass non-woven fabric substrate as shown in FIG. 3 and subjecting the surfaces of the copper foils 2 to a mechanical conditioning by the use of a brush and a chemical conditioning by the use of a pickling liquid as popularly practiced.

Figure 4:
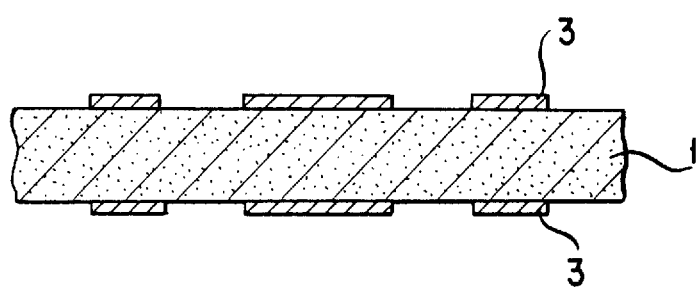

Then, such a double-sided printed circuit board as shown in FIG. 4 is obtained by forming circuits of etching resist on the surfaces of the copper foils 2 by screen printing or photo-process, etching the parts of the surfaces not covered with the etching resist thereby giving rise to conductor patterns 3, and peeling the etching resist off the surfaces.

Figure 5:
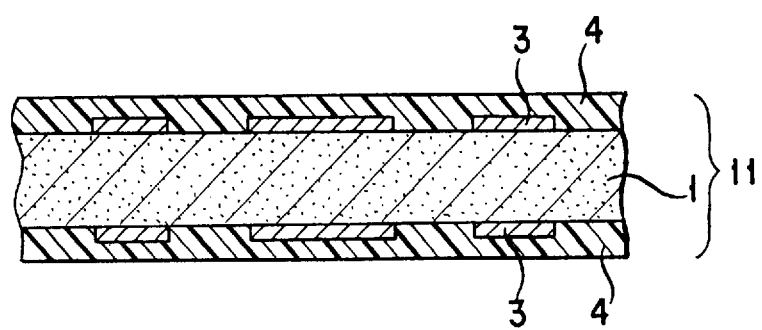

The opposite surfaces of this double-sided printed circuit board now serving as an inner layer plate are subjected to a mechanical conditioning by the use of a brush and a chemical conditioning by the use of a pickling liquid and then coated throughout the entire areas thereof with an insulating resin composition 4 so as to cover the conductor patterns 3 as shown in FIG. 5.

The insulating resin composition 4 to be used for the method of production according to the present invention has the property of assuming a semi-cured state when treated by the UV irradiation, undergoing the conversion from the semi-cured state to a softened state when pressed by a heated pressure roller at a temperature in the range of 80° to 150° C., and then assuming a thoroughly cured state when further heated at a temperature in the range of 140° to 160° C.

The application of the insulating resin composition 4 can be implemented by any of the known methods of high productivity in popular acceptance such as, for example, the screen printing method, curtain coating method, spray coating method, and roll coating method. By such a method, the insulating resin composition 4 is applied to the opposite surfaces of the double-sided printed circuit board. In this case, the applied layers of the insulating resin composition 4 have a thickness so adjusted that when copper foils 5 destined to form the next conductor layers are attached to their surfaces, the inner layer conductor patterns 3 and the outer layer copper foils 5 will be separated by a distance of not less than 50 μm, generally in the range of 50 to 60 μm.

In the case of the screen printing method, this adjustment of thickness of the applied layers of the insulating resin composition 4 can be attained by repeating the steps of and drying. In the case of the curtain coating application method, just one application can produce the applied layers in a thickness in the range of 50 to 60 μm.

After the insulating resin composition 4 has been applied to the opposite surfaces of the inner layer plate by the step mentioned above, the insulating resin composition 4 is caused to assume a semi-cured state by the UV irradiation. When the insulating resin composition contains an organic solvent, it is required to dry the applied layer of the composition prior to the UV irradiation.

Figure 6:
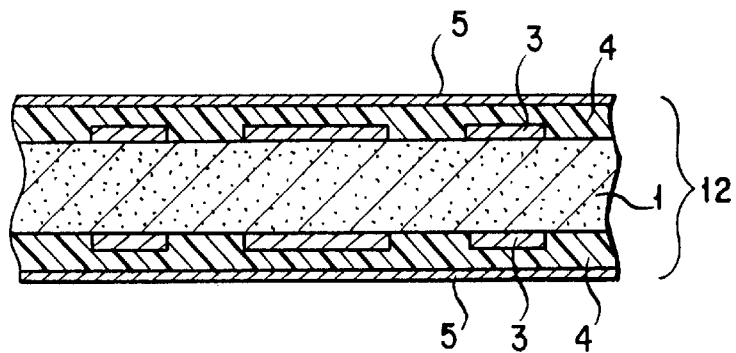
Figure 7:
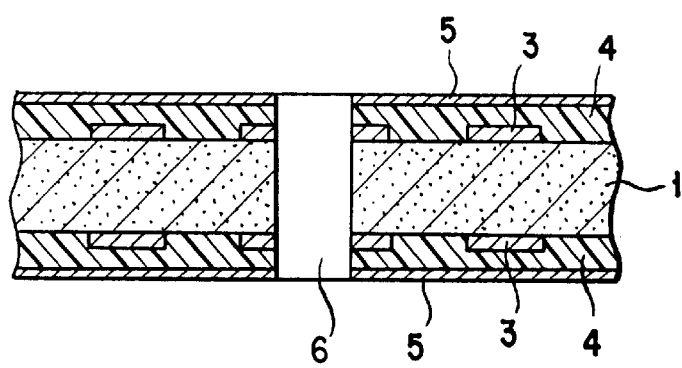
Figure 8:
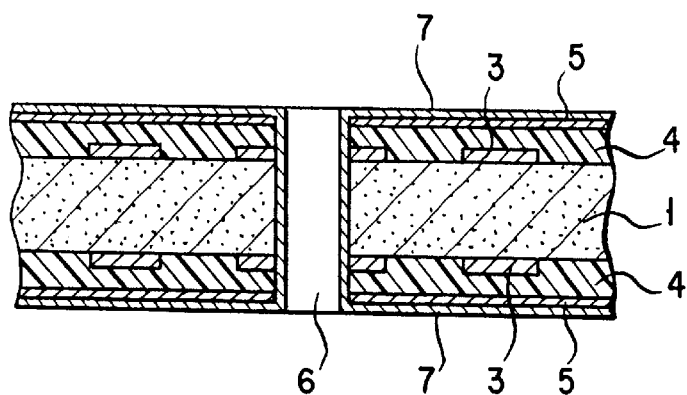
Figure 9:
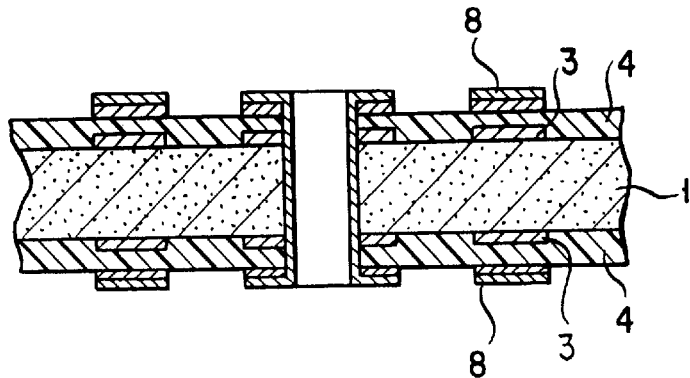
Figure 10:
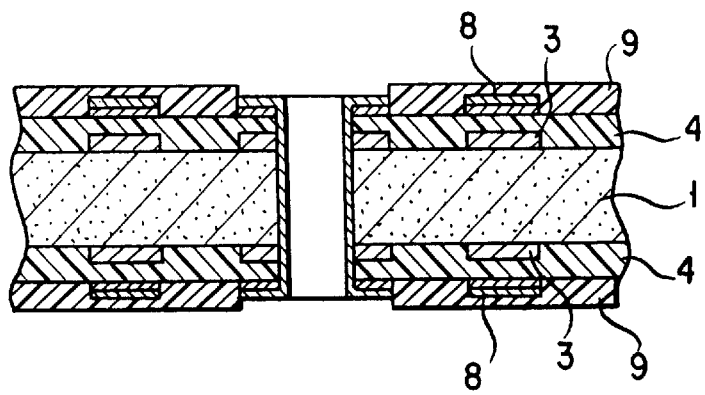
Figure 11:
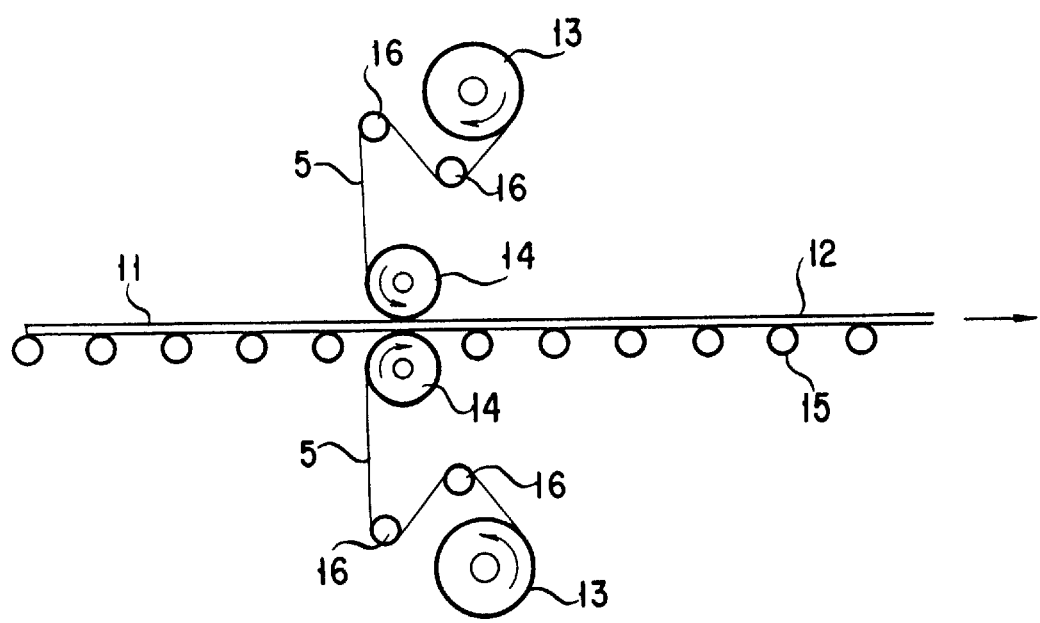
FIG. 11 is a schematic constructional representation of a method for continuously laminating copper foils one each to the opposite surface of an inner layer plate.

A four-layer plate such as is shown in FIG. 6 is obtained by subsequently superposing the copper foils 5 on the surfaces of the applied layers of the insulating resin composition 4 and laminating them. For the sake of this lamination of the copper foils 5, the inner layer plate having the insulating resin composition 4 applied thereto as shown in FIG. 5 (hereinafter referred to as "substrate 11") is conveyed on conveyor rollers 15 from the left side relative to the bearings of the diagram toward heated pressure rollers 14 as shown in FIG. 11. Above and below the substrate 11, copper foil rolls 13 each having the copper foil 5, 5 to 10 µm in working surface coarseness (amount of undulation of the coarsened surface of copper foil), 18 to 35 µm in thickness, and 100 to 200 m in length, wound on a hollow core are set in place. As the substrate 11 advances, the leading and the trailing edge of the substrate 11 are detected by a sensor (not shown). The copper foils 5 wound on the hollow cores are forwarded through the medium of auxiliary rollers 16 into the gap between the vertically paired heated pressure rollers 14 and are cut into stated lengths. The heated pressure rollers 14 which are continuously rotated heat and press the copper foils 5 against the opposite surfaces of the substrate 11 by virtue of the heat and pressure generated thereby and forward the substrate 11 coated by now with the copper foils 5 to the right. A multilayer laminate 12 such as is shown in FIG. 6 which has the copper foils 5 laminated to the opposite surfaces thereof is consequently obtained.

The heated pressure rollers 14 in this case each use a roller, 80 to 90 mm in diameter, and are adjusted so that when the substrate 11 has a width of 60 cm, the heated pressure rollers 14 will exert a load, 300 to 500 kgf, on the substrate. Thus, the load per unit length is in the range of 5 to 8.3 kgf. The rollers are kept at a temperature in the range of 80° to 150° C. and are operated at a rotational speed in the range of 0.5 to 3 m/min. The layers of the insulating resin composition 4 on the opposite surfaces of the substrate 11 are softened by the heat of the heated pressure rollers 14. The softened layers of the insulating resin composition 4 acquire exalted fastness of adhesion by following the undulating coarsened working surfaces of the copper foils 5. The multilayer laminate 12 shown in FIG. 6 is completed by further heating the layers of the insulating resin composition 4 at a temperature in the range of 140° to 160° C. for a period in the range of 30 to 60 minutes and consequently curing the layers.

The completed multilayer laminate 12 then undergoes such standard steps as the perforation of through-holes 6 (FIG. 7), deposition of panel copper plates 7 (FIG. 8), formation of outer layer conductor patterns 8 (FIG. 9), and formation of solder resist films 9 (FIG. 10) to give rise to the multilayer printed circuit board.

A multilayer printed circuit board of five or more layers can be easily produced by repeating the same steps as mentioned above further on the opposite surfaces of the multilayer printed circuit board produced in consequence of the steps mentioned above. In this case, however, the perforation of the through-holes, panel copper plating, and formation of solder resists are performed after the copper foils destined to form the outermost conductor layers have been fastened by lamination.

In the method for the production of the multilayer printed circuit board according to the present invention, the insulating resin layers can be deposited by the conventional simple procedure and, at the same time, the copper foils can be continuously laminated to the insulating resin layers by the heated pressure rollers. Thus, the facilities for effecting the production can be easily designed in a construction suitable for automation, the duration of the step of lamination can be shortened, the quality of the product can be improved, and the cost of equipment can be lowered. The method, accordingly, can lower the cost of production and provide an inexpensive multilayer printed circuit board.

While there have been shown and described present preferred embodiments of the invention pertaining to the method for the production of a multilayer printed circuit board, it is to be distinctly understood that the method of the invention is not limited thereto but may be otherwise variously embodied and practiced without departing from the spirit of the present invention. For example, the process of production is described above as using the copper foils 5 which have the working surfaces thereof coarsened preparatorily. The use of the copper foils of this kind may well be called preferable in the sense that the layers of the insulating resin composition which have been softened by the heat of the heated pressure rollers during the course of lamination are enabled to acquire exalted adhesive force by following the undulating coarsened working surfaces of the copper foils. Copper foils which have an adhesive agent applied thereto in advance may be used instead. It is particularly advantageous to use copper foils that have the adhesive agent applied in advance to the coarsened working surfaces thereof. In this case, the layers of the insulating resin composition acquire still higher adhesive strength. It is appropriate in this case to use an epoxy resin-based adhesive agent. Particularly, when the insulating resin composition of the present invention is used as the adhesive agent to be applied to the coarsened working surfaces of the copper foils, the copper foils thus coated with the resin composition exhibit higher adhesive force than the copper foils which do not use the resin composition for coating the coarsened working surfaces thereof.

Now, working examples and comparative examples which have specifically confirmed the effect of the present invention will be described below. Wherever "parts" and "%" are mentioned hereinafter, they shall be construed as meaning "parts by weight" and "% by weight" unless otherwise specified.

Example 1:

An insulating resin composition was obtained by compounding 50 parts of the solution (solid content 80%) of a phenol novolak type epoxy resin (produced by the Dow Chemical Company and marketed under product code of "D.E.N. 438") in 2-hydroxyethyl methacrylate (produced by Kyoeisha Kagaku K.K. and marketed under trademark designation of "Light Ester HO"), 20 parts of trimethylol propane triacrylate (produced by Dicel USB Ltd. and marketed under product code of "TMPTA"), 3.5 parts of dicyandiamide, 1 part of 2-ethyl anthraquinone, 25 parts of barium sulfate (produced by Sakai Chemical Industry Co., Ltd. and marketed under trademark designation of "BARI-FINE BF-10"), and 0.5 part of phthalocyanine green, premixing them, and kneading and dispersing the produced mixture with a three-roll mill.

From this insulating resin composition, a multilayer printed circuit board was produced by the method described above.

Example 2:

An insulating resin composition was obtained by following the procedure of Example 1 while compounding 30 parts of bisphenol A type epoxy resin (produced by Yuka-Shell Epoxy K.K. and marketed under trademark designation of "EFIKOTE 828"), 20 parts of bixylenol type epoxy resin (produced by Yuka-Shell Epoxy K.K. and marketed under product code of "YX-4000"), 25 parts of pentaerythritol triacrylate (produced by Kyoeisha Kagaku K.K. and marketed under product code of "PE-3A"), 3 parts of dicyandiamide, 1.5 parts of benzophenone, 20 parts of barium sulfate (BARIFINE® BF-10), and 0.5 part of phthalocyanine green instead.

From this insulating resin composition, a multilayer printed circuit board was produced by the method described above.

Example 3:

An insulating resin composition was obtained by following the procedure of Example 1 while compounding 50 parts of bisphenol A type epoxy resin having fine acrylic rubber particles dispersed therein [produced by Tohto Kasei K.K. and marketed under product code of "Epo Tohto" YR-528 (rubber content 20%)], 25 parts of pentaerythritol triacrylate (PE-3A), 3 parts of dicyandiamide, 1.5 parts of benzoin, 20 parts of barium sulfate (BARIFINE® BF-10), and 0.5 part of phthalocyanine green instead.

From this insulating resin composition, a multilayer printed circuit board was produced by the method described above.

Example 4:

Such a substrate 11 as is shown in FIG. 5 was manufactured by applying an insulating resin composition produced by following the procedure of Example 1 to the opposite surfaces of such a double-sided printed circuit board as is shown in FIG. 4 and irradiating the resultant composite plate with the UV light. Then, copper foils to be fastened to the substrate 11 by lamination had the working surfaces thereof preparatorily coarsened. An adhesive agent obtained by compounding and mixing 46 parts of the solution (solid content 80%) of bisphenol A type epoxy resin (produced by Tohto Kasei K.K. and marketed under trademark designation of "Epo Tohto" YD-011) in carbitol acetate, 36 parts of liquid bisphenol A type epoxy resin (produced by Yuka-Shell Epoxy K.K. and marketed under trademark designation of "EPIKOTE" 828), 14 parts of 4,4'-diaminodiphenyl methane (produced by Nippon Synthetic Chemical Industry Co., Ltd. and marketed under trademark designation of "Akumex H-84BM"), and 4 parts of carbitol acetate and kneading and dispersing the resultant mixture in a three-roll mill was applied to the copper foils and provisionally dried. The copper foils coated with the adhesive agent were hot pressed by the heated pressure rollers as described above to the opposite surfaces of the substrate obtained as described above. The composite plate consequently obtained was processed in the same manner as in the method of production mentioned above to produce a multilayer printed circuit board.

Comparative Example 1:

An insulating resin composition was obtained by following the procedure of Example 1 while compounding 30 parts of phenol novolak type epoxy resin (produced by the Dow Chemical Company and marketed under product code of "D.E.N. 431"), 30 parts of bisphenol A type epoxy resin (produced by Yuka-Shell Epoxy K.K. and marketed under trademark designation of "EPIKOTE" 828), 3.5 parts of dicyandiamide, 28 parts of barium sulfate (BARIFINE® BF-10), 0.5 part of phthalocyanine green, and 8 parts of carbitol acetate instead.

From this insulating resin composition, a multilayer printed circuit board was produced by following the procedure of the method of production mentioned above while effecting provisional drying at 80° C. for 30 fines instead of the UV irradiation.

Comparative Example 2:

An insulating resin composition was obtained by following the procedure of Example 1 while compounding 75 parts of the solution (solid content 70%) of bisphenol A epoxy acrylate (produced by Osaka Organic Chemical Industry Co., Ltd. and marketed under trademark designation of "Viscote 540") in 2-hydroxyethyl methacrylate (Light Ester HO), 3.5 parts of 2-ethyl anthraquinone, 21 parts of barium sulfate (BARIFINE® BF-10), and 0.5 part of phthalocyanine green instead.

From this insulating resin composition, a multilayer printed circuit board was produced by the method described above.

The multilayer printed circuit boards obtained in the working examples and the comparative examples cited above were each tested for the adhesive strength (peel strength) between the insulating resin layer and the first layer conductor pattern in accordance with the method specified in JIS (Japanese Industrial Standard) C-6481. The cross sections of the multilayer printed circuit boards were visually examined to determine the degree of uniformity of film thickness. The degree was rated on the two point scale, wherein ○ stands for uniform film thickness and x for lack of uniformity of film thickness. The percentage composition of each of the insulating resin layers is shown in Table 1 and the test results are shown in Table 2.

TABLE 1

| Insulating resin composition | Percentage composition (%) | | |
|---|---|---|---|
| | Epoxy resin | Fine rubber particles | UV monomer or oligomer |
| Example 1 | 40 | — | 30 |
| Example 2 | 50 | — | 25 |
| Example 3 | 40 | 10 | 25 |
| Example 4 | 40 | — | 30 |
| Comparative Example 1 | 60 | — | — |
| Comparative Example 2 | — | — | 75 |

TABLE 2

| Insulating resin composition | Copper foil used | Peel strength (kg/cm$^2$) | Uniformity of film thickness |
|---|---|---|---|
| Example 1 | Coarsened copper foil | 1.3 | ○ |
| Example 2 | Coarsened copper foil | 1.8 | ○ |
| Example 3 | Coarsened copper foil | 1.8 | ○ |
| Example 4 | Copper foil coated with adhesive agent | 2.0 | ○ |
| Comparative Example 1 | Coarsened copper foil | 1.4 | X |
| Comparative Example 2 | Coarsened copper foil | No adhesion | ○ |

It is clearly noted from the results shown in Table 2 that the multilayer printed circuit boards produced from the insulating resin compositions of the present invention showed ample adhesive strength and contained insulating resin layers of uniform film thickness. When an insulating resin composition compounding only epoxy resins as in Comparative Example 1 was used or when an insulating resin composition compounding only a monomer and an oligomer having an unsaturated double bond as in Comparative Example 2 was used, no multilayer printed circuit board was obtained because the copper foils failed to adhere to the insulating resin layer.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. An insulating resin composition for the build-up of multilayer circuits by the procedure of copper foil lamination, comprising (A) at least one species of epoxy resin having a softening point of not more than 110° C., (B) a monomer or an oligomer possessing an unsaturated double bond, (C) an epoxy resin curing agent, and (D) a photopolymerization initiator.

2. The composition according to claim 1, which contains said epoxy resin (A) having a softening point of not more than 110° C. at a concentration of not less than 20% by weight based on the weight of said composition.

3. The composition according to claim 1, which contains said monomer or oligomer (B) possessing an unsaturated double bond at a concentration of not more than 60% by weight based on the weight of said composition.

4. The composition according to claim 1, which further comprises fine rubber particles.

5. The composition according to claim 1, wherein said epoxy resin (A) is an epoxy resin varnish having fine rubber particles dispersed therein.

6. The composition according to claim 4, wherein said rubber particles have a particle diameter of not more than 10 μm.

7. The composition according to claim 4, wherein said rubber particles are made of an acrylic rubber.

8. The composition according to claim 1, wherein said epoxy resin curing agent (C) is selected from the group consisting of amines, polyamide resins, polysulfide resins, boron trifluoride-amine complexes, and novolak resins and is incorporated in the composition in a proportion such that the active hydrogen content in said curing agent is in the range of 0.5 to 1.5 equivalent weights per one epoxy equivalent of said epoxy resin (A).

9. The composition according to claim 1, wherein said epoxy resin curing agent (C) is an acid anhydride and is incorporated in the composition in a proportion such that the anhydrous acid content in said curing agent is in the range of 0.5 to 1.0 equivalent weight per one epoxy equivalent of said epoxy resin (A).

10. The composition according to claim 1, wherein solid epoxy resin curing agent (C) is selected from the group consisting of dicyandiamide, acid hydrazide, and a carboxyl group-containing compound and is incorporated in the composition in a proportion such that the active hydrogen content in said curing agent is in the range of 0.2 to 1.2 equivalent weights per one epoxy equivalent of said epoxy resin (A).

11. The composition according to claim 1, wherein said photopolymerization initiator (D) is at least one compound selected from the group consisting of acetophenones, benzophenones, benzoin and alkyl ethers thereof, ketals, thioxanthones, anthraquinones, organic peroxides, thiol compounds, and organic halogen compounds and is used in a proportion in the range of from 0.2 to 30 parts by weight, based on 100 parts by weight of said monomer or oligomer (B).

12. The composition according to claim 1, which further comprises an organic solvent.

13. The composition according to claim 1, which further comprises a filler.

14. The composition according to claim 1, which further comprises a color pigment.

15. A method for the production of a multilayer printed circuit board, comprising the steps of providing a printed circuit board comprising an insulating substrate and at least one layer of conductor pattern formed thereon and forming on said printed circuit board an outer circuit layer containing an insulating resin layer and a layer of outer conductor pattern, said step of forming the outer circuit layer comprising:

applying a thin layer of an insulating resin composition to said printed circuit board throughout the entire surface thereof having the conductor pattern formed thereon so as to form an insulating resin layer covering said conductor pattern, wherein said insulating resin composition comprising (A) at least one species of epoxy resin having a softening point of not more than 110° C., (B) a monomer or an oligomer possessing an unsaturated double bond, (C) an epoxy resin curing agent, and (D) a photopolymerization initiator, irradiating the insulating resin layer with ultraviolet light, superposing a copper foil on said insulating resin layer by means of a heated pressure roller thereby effecting lamination thereof, thermally curing said insulating resin composition thereby obtaining a multilayer laminate, forming a through-hole in said multilayer laminate, depositing a copper layer on surfaces of said copper foil and wall of said through-hole, selectively etching said copper layer and said copper foil of said multilayer laminate to impart an outer conductor pattern thereto, and covering said outer conductor pattern except in those areas to be soldered with a solder mask, thereby obtaining a multilayer printed circuit board.

16. The method according to claim 15, further comprising a step of forming an inner circuit layer to be carried out at least one time prior to said step of forming the outer circuit layer, said step of forming the inner circuit layer comprising:

applying a thin layer of said insulating resin composition to said printed circuit board throughout the entire surface thereof having the conductor pattern formed thereon so as to form an insulating resin layer covering said conductor pattern, irradiating the insulating resin layer with ultraviolet light, superposing a copper foil on said insulating resin layer by means of a heated pressure roller thereby effecting lamination thereof, thermally curing said insulating resin composition thereby obtaining a multilayer laminate, and selectively etching said copper foil of said multilayer laminate to impart a conductor pattern thereto.

17. The method according to claim 15, wherein a liquid insulating resin composition is applied to the surface of said printed circuit board.

18. The method according to claim 15, wherein a dry film of said insulating resin composition is applied to the surface of said printed circuit board.

19. The method according to claim 15, wherein said copper foil is a copper foil having the working surface thereof coarsened with an adhesive agent.

20. A method for the production of a multilayer printed circuit board, comprising the steps of providing a printed circuit board comprising an insulating substrate and at least one layer of conductor pattern formed thereon and forming on said printed circuit board an outer circuit layer containing an insulating resin layer and a layer of outer conductor pattern, said step of forming the outer circuit layer comprising:

provided a resin-laminated copper foil prepared by applying an insulating resin composition to a surface of a copper foil and irradiating the resin composition with ultraviolet light, wherein said insulating resin composition comprising (A) at least one species of epoxy resin having a softening point of not more than 110° C., (B) a monomer or an oligomer possessing an unsaturated double bond, (C) an epoxy resin curing agent, and (D) a photopolymerization initiator, superposing said resin-laminated copper foil on said printed circuit board by means of a heated pressure roller thereby effecting lamination thereof, thermally curing said insulating resin composition thereby obtaining a multilayer laminate, forming a through-hole in said multilayer laminate, depositing a copper layer on surfaces of said copper foil and wall of said through-hole, selectively etching said copper layer and said copper foil of said multilayer laminate to impart an outer conductor pattern thereto, and covering said outer conductor pattern except in those areas to be soldered with a solder mask, thereby obtaining a multilayer printed circuit board.

21. The method according to claim 20, further comprising a step of forming an inner circuit layer to be carried out at least one time prior to said step of forming the outer circuit layer, said step of forming the inner circuit layer comprising:

superposing said resin-laminated copper foil on said printed circuit board by means of a heated pressure roller thereby effecting lamination thereof, thermally curing said insulating resin composition thereby obtaining a multilayer laminate, and selectively etching said copper foil of said multilayer laminate to impart a conductor pattern thereto.

22. The method according to claim 20, wherein said copper foil is a copper foil having the working surface thereof coarsened with an adhesive agent.

23. A method for the production of a multilayer printed circuit board, comprising the steps of providing a printed circuit board comprising an insulating substrate and at least one layer of conductor pattern formed thereon and forming on said printed circuit board an outer circuit layer containing an insulating resin layer and a layer of outer conductor pattern, said step of forming the outer circuit layer comprising:

providing a resin-laminated copper foil prepared by applying an insulating resin composition to a surface of a copper foil and irradiating the resin composition with ultraviolet light, wherein said insulating resin composition comprising (A) at least one species of epoxy resin having a softening point of not more than 110° C., (B) a monomer or an oligomer possessing an unsaturated double bond, (C) an epoxy resin curing agent, and (D) a photopolymerization initiator, applying a thin layer of said insulating resin composition to said printed circuit board throughout the entire surface thereof having the conductor pattern formed thereon so as to form an insulating resin layer covering said conductor pattern, irradiating the insulating resin layer with ultraviolet light, superposing said resin-laminated copper foil on said insulating resin layer by means of a heated pressure roller thereby effecting lamination thereof, thermally curing said insulating resin composition thereby obtaining a multilayer laminate, forming a through-hole in said multilayer laminate, depositing a copper layer on surfaces of said copper foil and wall of said through-hole, selectively etching said copper layer and said copper foil of said multilayer laminate to impart an outer conductor pattern thereto, and covering said outer conductor pattern except in those areas to be soldered with a solder mask, thereby obtaining a multilayer printed circuit board.

24. The method according to claim 23, further comprising a step of forming an inner circuit layer to be carried out at least one time prior to said step of forming the outer circuit layer, said step of forming the inner circuit layer comprising:

applying a thin layer of said insulating resin composition to said printed circuit board throughout the entire surface thereof having the conductor pattern formed thereon so as to form an insulating resin layer covering said conductor pattern, irradiating the insulating resin layer with ultraviolet light, superposing said resin-laminated copper foil on said insulating resin layer by means of a heated pressure roller thereby effecting lamination thereof, thermally curing said insulating resin composition thereby obtaining a multilayer laminate, and selectively etching said copper foil of said multilayer laminate to impart a conductor pattern thereto.

25. The method according to claim 23, wherein said copper foil is a copper foil having the working surface thereof coarsened with an adhesive agent.

26. The method according to claim 23, wherein a liquid insulating resin composition is applied to the surface of said printed circuit board.

27. The method according to claim 23, wherein a dry film of said insulating resin composition is applied to the surface of said printed circuit board.

28. The method according to claim 15 or claim 19, wherein said copper foil is coated with an adhesive agent.

29. The method according to claim 20 or claim 22, wherein said copper foil is coated with an adhesive agent.

30. The method according to claim 23 or claim 25, wherein said copper foil is coated with an adhesive agent.

* * * * *